(12) United States Patent
Koh

(10) Patent No.: US 7,049,195 B2
(45) Date of Patent: May 23, 2006

(54) METHODS OF FABRICATING NON-VOLATILE MEMORY DEVICES

(75) Inventor: Kwan-Ju Koh, Bucheon (KR)

(73) Assignee: DongbuAnam Semiconductor Inc., Seoul (KR)

( * ) Notice: Subject to any disclaimer, the term of this patent is extended or adjusted under 35 U.S.C. 154(b) by 234 days.

(21) Appl. No.: 10/749,608

(22) Filed: Dec. 30, 2003

(65) Prior Publication Data
US 2004/0157451 A1    Aug. 12, 2004

(30) Foreign Application Priority Data
Jan. 30, 2003    (KR) ............... 10-2003-0006416

(51) Int. Cl.
*H01L 21/336*    (2006.01)
(52) U.S. Cl. .................... 438/261; 438/954
(58) Field of Classification Search ........... 438/261, 438/954
See application file for complete search history.

(56) References Cited

U.S. PATENT DOCUMENTS

| | | | |
|---|---|---|---|
| 5,387,534 A | 2/1995 | Prall ................ 437/52 |
| 5,424,569 A | 6/1995 | Prall ................ 257/324 |
| 6,117,730 A * | 9/2000 | Komori et al. ........ 438/258 |
| 6,440,797 B1 | 8/2002 | Wu et al. ............. 438/261 |
| 6,444,545 B1 | 9/2002 | Sadd et al. ........... 438/503 |
| 6,794,249 B1 * | 9/2004 | Palm et al. ........... 438/259 |

* cited by examiner

*Primary Examiner*—Howard Weiss
(74) *Attorney, Agent, or Firm*—Andrew D. Fortney

(57) ABSTRACT

The present disclosure is directed to a non-volatile memory device having a SONOS structure and a method of fabricating the same, wherein the non-volatile memory device having the SONOS structure is fabricated using a simple and lower cost method by greatly reducing the number of the photo engraving process. As disclosed herein, in one example a method of fabricating a non-volatile memory device includes forming a sacrificial oxide film on a semiconductor substrate and selectively etching the sacrificial oxide film to expose the semiconductor substrate with a predetermined width; injecting first conductive type impurity ions into the exposed semiconductor substrate to form a first semiconductor region, forming an additional oxide and nitride film on the entire upper surface of the semiconductor substrate in order; selectively etching the nitride film, the additional oxide, and the sacrificial oxide film to form a gate window which exposes the semiconductor substrate with a predetermined width; forming a gate oxide film over the entire upper surface of the semiconductor substrate; forming polysilicon layer on the gate oxide film to fill in the gate window; carrying out a CMP process until the sacrificial oxide film is exposed; removing the sacrificial oxide film, and the gate oxide film, the nitride film, and the additional oxide formed on the side wall of the polysilicon layer; injecting second conductive type impurity ions into portions of the semiconductor substrate, which corresponds to the outer part of the polysilicon layer, to form source and drain regions.

9 Claims, 3 Drawing Sheets

METHODS OF FABRICATING NON-VOLATILE MEMORY DEVICES

TECHNICAL FIELD

The present disclosure relates to a semiconductor devices and, more particularly, to methods of fabricating non-volatile memory devices.

BACKGROUND

In general, semiconductor memory devices are roughly classified into volatile memory devices and non-volatile memory devices. Most of the volatile memory devices are random access memory (RAM) such as dynamic random access memory (DRAM), static random access memory (SRAM), etc. Volatile memory devices are devices that, when power is supplied to the volatile memory, it is possible to input and preserve data, but, when power to the volatile memory is interrupted, the information therein is lost.

Conversely, most of the non-volatile memory devices are read only memory (ROM), and thus it is possible to preserve data even when power to the device is interrupted.

Currently, on the process technology side, the non-volatile memory device is classified into a floating gate group and a metal/insulator/semiconductor (MIS) group in which dielectric films of two or more types are layered to be two or three floor.

The non-volatile memory device of the floating gate group stores data using potential well, and currently, the representative structure thereof is an EPROM tunnel oxide (ETOX) structure that is widely applied to an electrically erasable programmable read only memory (EEPROM).

On the other hand, the non-volatile memory device of the MIS group memorizes data using traps that exist in dielectric film bulk, an interface between dielectric films, and an interface between a dielectric film and a semiconductor. Currently, the representative structure thereof is a metal/ silicon ONO semiconductor (MONOS/SONOS) structure that has been used as an EEPROM.

Conventional arts relating to a flash memory having the SONOS structure are disclosed in U.S. Pat. Nos. 6,440,797; 6,444,545; 5,424,569; and 5,387,534.

FIG. 1 is a cut view showing a non-volatile memory device having a conventional SONOS structure, and, as shown in FIG. 1, phosphorus is injected into a semiconductor substrate 1 to form a first semiconductor region 2, and an ONO layer 3 having a oxide/nitride/oxide laminated structure is formed thereon, and then polysilicon layer 4 is formed on the ONO layer 3, such that the SONOS structure of a semiconductor/ONO/semiconductor structure is accomplished.

In a method of fabricating a non-volatile memory device having such conventional SONOS structure, because a photo-engraving process has to be carried out repeatedly, there is a problem of complicated process, much manufacturing time, and much cost to manufacture.

DETAILED DESCRIPTION

FIGS. 2a to 2f are cut views showing a method of fabricating non-volatile memory device according to the present invention.

Figure 1:
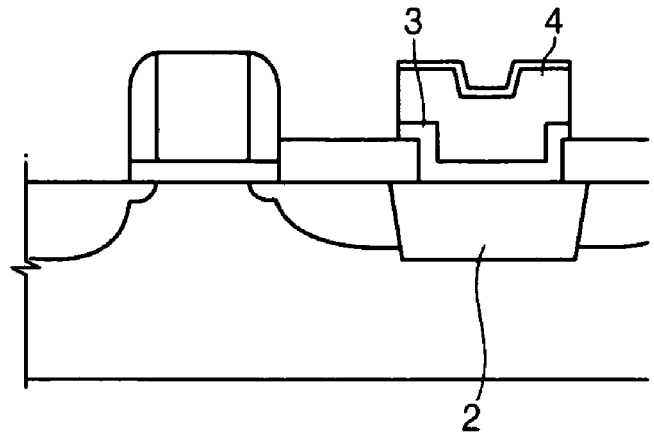
FIG. 1 is a cut view showing a conventional non-volatile memory device.
Figure 2A:
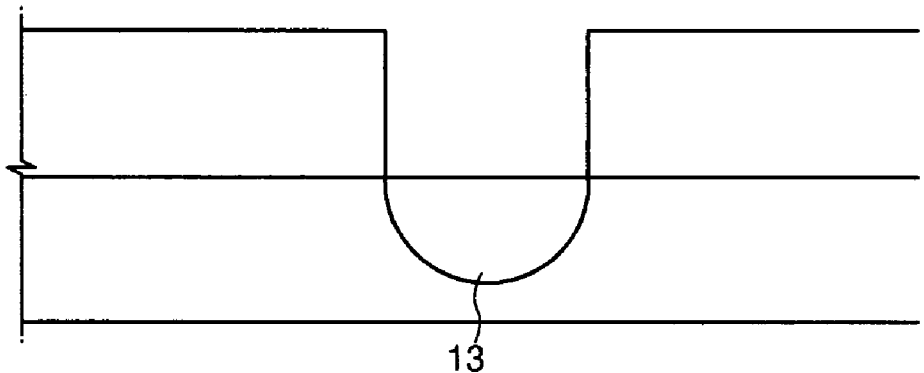
FIGS. 2a to 2f are cut views showing the results of an example method of fabricating non-volatile memory device.

First, as shown in FIG. 2a, a sacrificial oxide film 12 is formed on a silicon wafer 11, and a first photo engraving process is carried out to selectively etch the sacrificial oxide film 12, and the etched portion of the silicon wafer 11 is exposed.

At this point, the sacrificial oxide film 12 is etched to have proper size and width in consideration of fact that SONOS device will be formed in a portion of the sacrificial oxide film 12 that is to be etched subsequently, and in the same manner, deposition thickness of the sacrificial oxide film 12 is also decided to be proper size for the SONOS device.

Figure 2B:
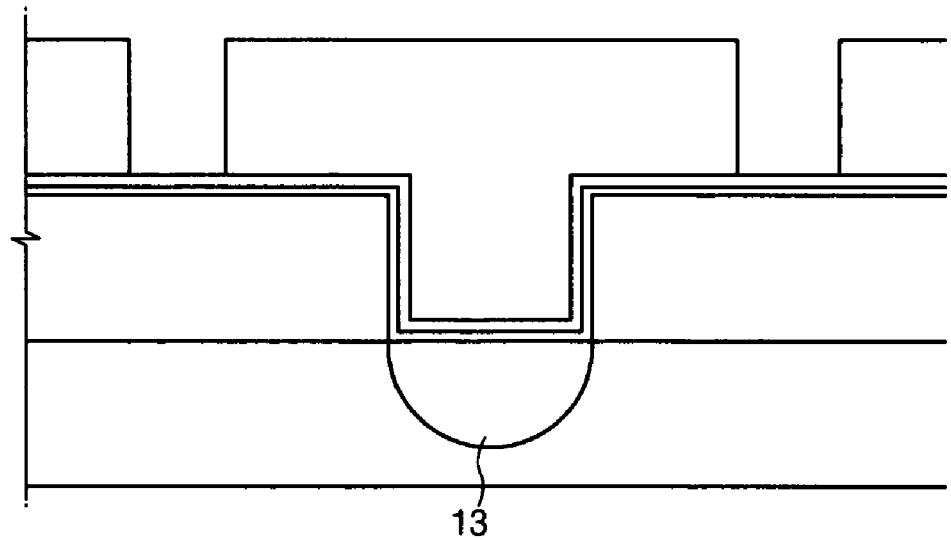

Subsequently, as shown in FIG. 2b, an additional oxide 14 and a nitride film 15 are laminated on the entire upper surface of the sacrificial oxide film 12 including the exposed silicon wafer 11 to form an ONO layer.

Then, photoresistive film is applied on the nitride film 15, and then exposure and development processes are carried out to form a photoresistive film pattern 16 for forming a gate.

Figure 2C:
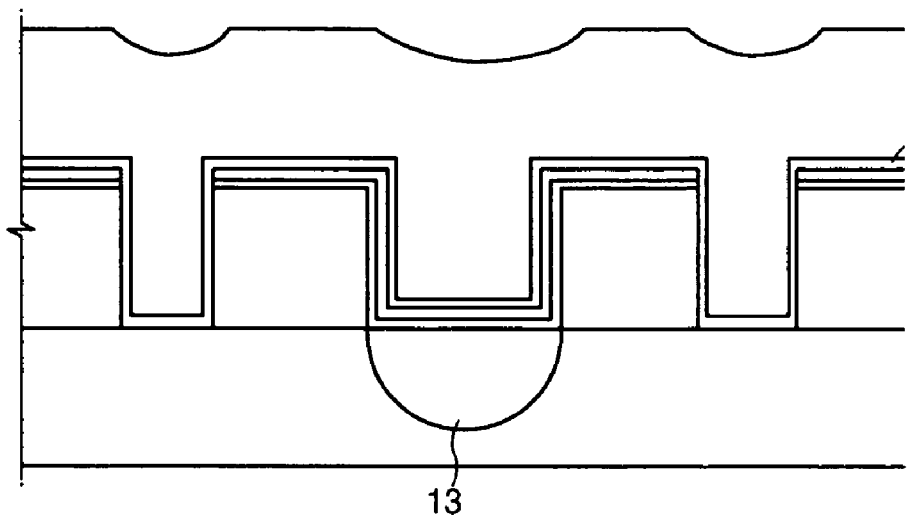

Next, as shown in FIG. 2c, the exposed nitride film 15, a second photo engraving process is carried out to etch the additional oxide 14, and the sacrificial oxide film 12 using the photoresistive pattern 16 as a mask, and thus the silicon wafer 11 is exposed through the etched portion.

Subsequently, a gate oxide film 17 is formed over the entire upper surface of the silicon wafer 11, and then polysilicon layer 18 is formed thereon thickly.

At this point, the polysilicon layer 18 is completely filled in a portion etched through the second photo engraving process, and the filled polysilicon layer 18 functions as a gate. Thus, the polysilicon layer, which will function as a gate, is formed using a burying method, i.e., a damascene process.

Figure 2D:
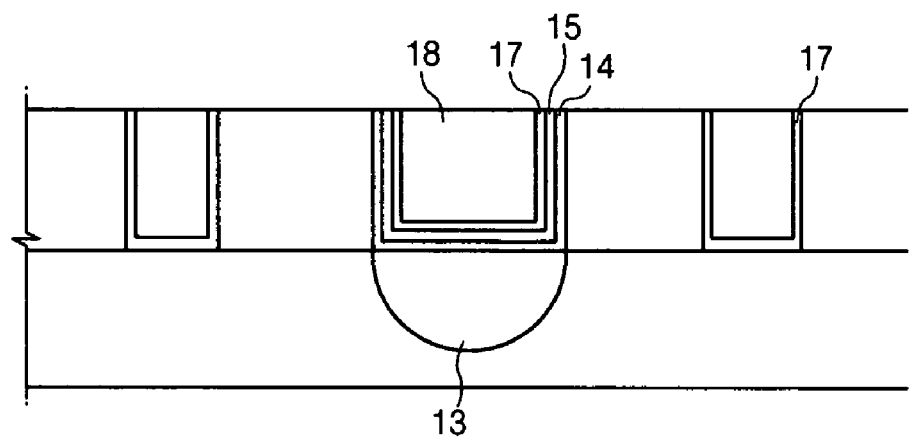

Next, as shown in FIG. 2d, the chemical mechanical polishing (CMP) process is carried out to flat the upper surface until the sacrificial oxide film is exposed. At this point, the etching process is closed at the point of time when the nitride film 15 is exposed using the nitride film 15 as a polishing stopper layer, and then the sacrificial oxide film 12 is exposed by carrying out over-etch for a predetermined time.

Figure 2E:
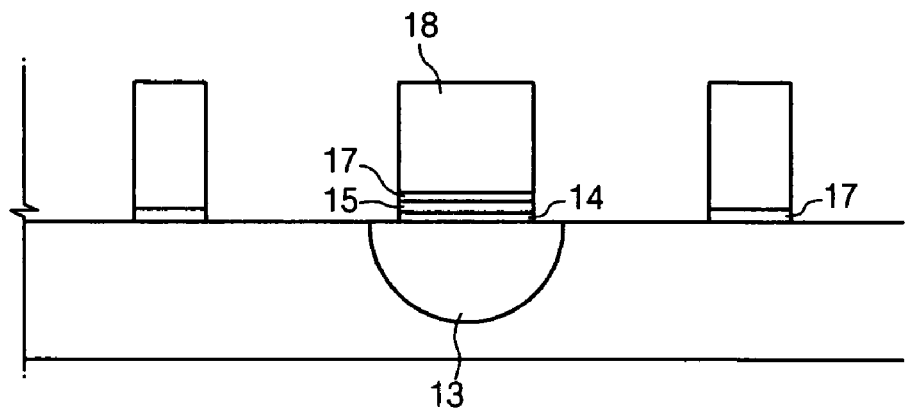

Then, as shown in FIG. 2e, a gate oxide film 17, the nitride film 15, and the additional oxide 14 formed on the side walls of the sacrificial oxide film 12 and the polysilicon layer 18 are removed using a wet-etch.

Figure 2F:
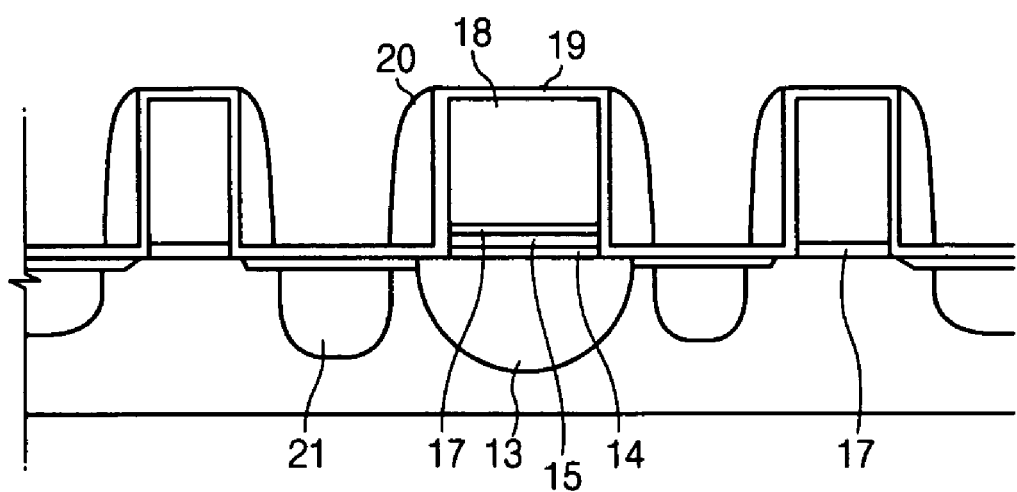

Then, as shown in FIG. 2f, a protection film 19 is formed over the entire upper surface of the silicon wafer 11, and then a second conductive type impurity ions, the conductive type of which is opposite to the first conductive type impurity ions injected into the first semiconductor region 13, is injected into the silicon wafer 11 using the polysilicon layer 18 as a mask to form a lightly doped drain (LDD) region.

Subsequently, the side-walls 20 are formed on the protection film 19 located on the side walls of the polysilicon layer 18, the gate oxide film 17, the nitride film 15, and the additional oxide 14, and then, impurity ions, which has the same conductive type as the second conductive type impurity ions injected into the LDD region, is injected into the silicon wafer 11 using the side-walls 20 and the polysilicon layer 18 as a mask to from source and drain regions 21, such that the non-volatile memory device having the SONOS structure comes to be fabricated.

As described above, in the example disclosed method, the non-volatile memory device having the SONOS structure can be fabricated using the photo engraving process only twice. According to the example method, a gate is formed using the damascene process, and thus the non-volatile memory device having the SONOS structure can be fabricated using the photo engraving process only twice, such that the process therefore can be simplified and the cost and the time required for fabrication can be decreased.

According to one example method, the method includes forming a sacrificial oxide film on a semiconductor substrate and selectively etching the sacrificial oxide film to expose the semiconductor substrate with a predetermined width; injecting first conductive type impurity ions into the exposed semiconductor substrate to form a first semiconductor region, forming an additional oxide and nitride film on the entire upper surface of the semiconductor substrate in order; selectively etching the nitride film, the additional oxide, and the sacrificial oxide film to form a gate window which exposes the semiconductor substrate with a predetermined width; forming a gate oxide film over the entire upper surface of the semiconductor substrate; forming polysilicon layer on the gate oxide film to fill in the gate window; carrying out a CMP (Chemical Mechanical Polishing) process until the sacrificial oxide film is exposed; removing the sacrificial oxide film, and the gate oxide film film, the nitride film, and the additional oxide formed on the side wall of the polysilicon layer; injecting second conductive type impurity ions into portions of the semiconductor substrate, which corresponds to the outer part of the polysilicon layer, to form source and drain regions.

Although a preferred embodiment of the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method of fabricating a non-volatile memory device, the method comprising:
   forming a sacrificial oxide film on a semiconductor substrate and selectively etching the sacrificial oxide film to expose the semiconductor substrate with a predetermined width;
   injecting first conductive type impurity ions into the exposed semiconductor substrate to form a first semiconductor region;
   forming an additional oxide and nitride film on the entire upper surface of the semiconductor substrate in order;
   etching the nitride film, the additional oxide, and the sacrificial oxide film selectively to form a gate window which exposes the semiconductor substrate with a predetermined width;
   forming a gate oxide film over the entire upper surface of the semiconductor substrate;
   forming polysilicon layer on the gate oxide film to fill in the gata window;
   carrying out a CMP (Chemical Mechanical Polishing) process until the sacrificial oxide film is exposed;
   removing the sacrificial oxide film, and the gate oxide film film, the nitride film, and the additional oxide formed on the side wall of the polysilicon layer; and
   injecting second conductive type impurity ions into portions of the semiconductor substrate, which corresponds to the outer part of the polysilicon layer, to form source and drain regions.

2. A method as defined by claim 1, wherein in carrying out a CMP process until the sacrificial oxide film is exposed, the etching process is closed at the point of time when the nitride film is exposed using the nitride film as a polishing stopper layer, and then the sacrificial oxide film is exposed by carrying out over-etch for a predetermined time.

3. A method as defined by claim 2, wherein the sacrificial oxide film, and the gate oxide film, the nitride film, and the additional oxide formed on the side wall of the polysilicon layer are removed using a wet-etch.

4. A method as defined by claim 3, wherein the source and the drain regions are formed by injecting second conductive type impurity ions into the silicon substrate using the polysilicon layer as a mask to form an LDD region, and forming side-walls on the side walls of the polysilicon layer, and then injecting the second conductive type impurity ions into the semiconductor substrate using the side-walls and the polysilicon layer as a mask.

5. A method as defined by claim 4, wherein, before forming the LDD region, a protection film is formed over the entire upper surface of the semiconductor substrate.

6. A method as defined by claim 2, wherein the source and the drain regions are formed by injecting second conductive type impurity ions into the silicon substrate using the polysilicon layer as a mask to form an LDD region, and forming side-walls on the side walls of the polysilicon layer, and then injecting the second conductive type impurity ions into the semiconductor substrate using the side-walls and the polysilicon layer as a mask.

7. A method as defined by claim 6, wherein, before forming the LDD region, a protection film is formed over the entire upper surface of the semiconductor substrate.

8. A method as defined by claim 1, wherein the source and the drain regions are formed by injecting second conductive type impurity ions into the silicon substrate using the polysilicon layer as a mask to form an LDD (Low Doped Drain) region, and forming side-walls on the side walls of the polysilicon layer, and then injecting the second conductive type impurity ions into the semiconductor substrate using the side-walls and the polysilicon layer as a mask.

9. A method as defined by claim 8, wherein, before forming the LDD region, a protection film is formed over the entire upper surface of the semiconductor substrate.

* * * * *